United States Patent
Rotzoll et al.

(10) Patent No.: US 10,523,157 B1
(45) Date of Patent: Dec. 31, 2019

(54) METHOD FOR IMPROVING THRESHOLD ACCURACY IN AN RFID-DEVICE THROUGH OFFSET CANCELLATION

(71) Applicant: EM Microelectronic-Marin SA, Marin (CH)

(72) Inventors: Robert R. Rotzoll, Cascade, CO (US); Kevin Scott Buescher, Colorado Springs, CO (US)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 16/142,733

(22) Filed: Sep. 26, 2018

(51) Int. Cl.
| | |
|---|---|
| *G06K 19/00* | (2006.01) |
| *H03F 1/02* | (2006.01) |
| *H03K 5/24* | (2006.01) |
| *H03F 3/19* | (2006.01) |
| *G06K 7/10* | (2006.01) |
| *H03K 3/037* | (2006.01) |
| *H03M 1/66* | (2006.01) |

(52) U.S. Cl.
CPC ....... *H03F 1/0205* (2013.01); *G06K 7/10366* (2013.01); *H03F 3/19* (2013.01); *H03K 3/037* (2013.01); *H03K 5/24* (2013.01); *H03F 2200/451* (2013.01); *H03M 1/66* (2013.01)

(58) Field of Classification Search
USPC .......... 235/435, 439, 454, 487, 492; 340/10, 340/572
See application file for complete search history.

(56) References Cited

U.S. PATENT DOCUMENTS

2012/0313757 A1\* 12/2012 Volpi ................... G06K 7/0008
340/10.1

\* cited by examiner

*Primary Examiner* — Matthew Mikels
(74) *Attorney, Agent, or Firm* — Oblon, McClelland, Maier & Neustadt, L.L.P.

(57) ABSTRACT

A method for improving threshold accuracy in an RFID-device through offset cancellation, and including the steps of providing a comparator including a first and a second amplifiers, providing a current output digital-to-analogue converter, AC-coupling in an RF-signal into the detector circuit, during a first phase, applying a signal based on the RF-signal into the first amplifier while a current of the DAC is set to zero, and applying a current of the DAC into the second amplifier while a signal based on the RF-signal is set to zero, during a second phase, applying the current of the DAC into the first amplifier while the signal based on the RF-signal is set to zero, and applying the signal based on the RF-signal into the second amplifier while the current of the DAC is set to zero.

12 Claims, 1 Drawing Sheet

METHOD FOR IMPROVING THRESHOLD ACCURACY IN AN RFID-DEVICE THROUGH OFFSET CANCELLATION

FIELD OF THE INVENTION

The present invention primarily relates to the field of detector circuits and in particular to detector circuits suitable for RFID-applications. Moreover, such a detector circuit is normally implemented in a receiver module of an RFID-device, such as an RFID-tag or an RFID-reader.

BACKGROUND OF THE INVENTION

Radio Frequency IDentification (RFID) can be used for locating and identifying objects. In this context, the RFID-systems are particularly useful for tracking of a large numbers of objects. These systems usually comprise RFID-readers and RFID-tags. When a power management system of an RFID-tag includes an energy storage device, e.g. a battery, then the tags are known as active tags. RFID-tags powered solely by the received RF-signals are called passive tags.

Intrasystem communication is typically conducted by an RFID-reader interrogating one or more RFID-tags by sending a Radio Frequency (RF) wave. In response, the tag that senses the interrogating RF-wave responds by transmitting back another RF-wave.

A significant challenge when designing RFID-readers is the correct detection of the response signal generated by the tags. Typically, the detection takes place in a detector that is part of a receiver module of the RFID-reader. Above challenge is at least in part caused by the greatly varying power value of the response RF-signal. Accordingly, the detector of the receiver module needs to have a stable threshold with respect to the power value of the incoming signal in order to distinguish relevant incoming RF-signals.

In this context, an inherent shortcoming of a typical IC-fabrication process for circuits being part of RFID-devices, typically manufactured using CMOS-technology, is the existence of a random variability of the physical parameters of the manufactured circuits. In particular, this mismatch, randomly affecting the parameters of equally designed and closely positioned circuit components, is difficult to mitigate and may significantly degrade the performance of the RFID-device as a whole and in particular the achieving of a stable threshold. A well-known method for fabrication mismatch mitigation is based on the assumption that the local variations average out as the area of the MOS-transistor increases, to scale the transistor size. However and in addition to increasing the area of the die, this usually reduces the bandwidth of the circuits and implies a higher circuit current in order to meet the performance specifications. A higher circuit current typically results in an increased power consumption in an RFID-device.

SUMMARY OF THE INVENTION

It is therefore an object of the present invention to provide a method and an improved detector circuit implemented in a receiver module of an RFID-device. The method and/or the circuit at hand at least alleviates the drawbacks caused by the fabrication mismatches present in the circuits of the detector. A further general purpose is to improve threshold accuracy in a detector circuit of an RFID-device.

More specifically, the method according to the invention takes into consideration that the incoming RF-signal and the current of the detector circuit are perceived as being differential. Hence, the circuit is performing a differential processing, but the differential signal that is sensed stems from a single-ended input signal. In consequence, when these differential signals are applied to the detector circuit of an RFID-device, they will have different values in different phases of the clock cycle. On the other hand, the offsets present in the circuit are intrinsically common mode and they do not change value during the two phases of the clock cycle. As a result, by implementing the method according to the invention the circuit offsets may to a large extent be removed from the output signal of the detector circuit by performing simple arithmetic operations.

The method further contributes to improved manufacturing process of IC-circuits as the parameter variation associated with each circuit is greatly reduced. This also entails that more accurate detector circuits, i.e. having smaller deviation from detector target value, may be manufactured.

Moreover, the improved detector circuit may be manufactured by readily-available, standard semi-conductor components for a cost-efficient production process.

In a first aspect, a method to be implemented in a detector circuit being part of an RFID-device is provided, said circuit being particularly operable to process signals in the RF-domain. The purpose of the implemented method is inter alia to at least alleviate, or reduce, effects of the fabrication mismatch present in the circuit. A further general purpose is to improve threshold accuracy in a detector circuit of the RFID-device. The method comprises following steps:

providing a comparator comprising a first amplifier and a second amplifier, providing a current output digital-to-analogue converter, AC-coupling in an RF-signal into the detector circuit, applying, during a first phase, a signal based on the RF-signal into the first amplifier while a current value of the current output digital-to-analogue converter is set to zero, applying, during the first phase, a current value of the current output digital-to-analogue converter into the second amplifier while a signal based on the RF-signal is set to zero, applying, during a second phase, the current of the current output digital-to-analogue converter into the first amplifier while the signal based on the RF-signal is set to zero, and applying, during the second phase, the signal based on the RF-signal into the second amplifier while the current of the current output digital-to-analogue converter is set to zero.

Here, the signal based on the RF-signal carries information on the signal strength of the RF-signal.

By implementing the method in the power detector circuit, it is taken into consideration that the incoming RF-signals and the currents of the detector circuit become differential in nature. Hence, they will have different values in the first, respectively the second phases of the clock cycle of the detector circuit. On the other hand, the offsets present in the circuit are systemic and do not change value during the two phases of the clock cycle. More precisely, the detector circuit's response to the one of RF-signal/circuit current being applied to a first amplifier is isolated by setting the value for the second one of RF-signal/circuit current to zero. In order to determine the individual offsets associated with the other one of the RF-signal/circuit current, the setup needs to be reversed. As a result, systemic offset values generated during the first phase of the clock cycle are obtained.

In the same manner, corresponding offset values are generated during the second phase of the clock cycle. Accordingly, intrinsic properties of the detector circuit are used to generate two sets of relevant offset data, both data sets characterizing the same circuit. The systemic circuit offset may subsequently to a large extent be removed from the output signal of the detector circuit by performing simple arithmetic operations.

In a preferred embodiment, this systemic circuit offset may be removed by subtracting a resulting signal value obtained in the second phase from a resulting signal value obtained in the first phase. In this way, the offset data sets from the two phases essentially cancel one another.

In a further embodiment, the obtained output value, i.e. once the offsets have been removed, is used to determine whether the AC-coupled RF-signal exceeds a detector threshold value. This is typically done by evaluating whether the obtained output value exceeds zero. If so, the threshold has been reached.

In yet another embodiment, the first and the second amplifiers are auto-zero amplifiers operating in ping-pong mode. Accordingly, each amplifier allows auto-zero of its input offset. In ping-pong mode, while one of the amplifiers is zeroed during an initial period, the other one is active. Then, during the next period, the previously zeroed amplifier is switched on, while the other amplifier is zeroed.

In another and independent aspect of the invention a detector circuit for implementing the above method is provided, said detector circuit being part of an RFID-device, and comprising a comparator having a first amplifier and a second amplifier, a current output digital-to-analogue converter and means for AC-coupling in an RF-signal into the detector circuit, wherein the first amplifier is configured to receive a signal based on the RF-signal while a current value of the current output digital-to-analogue converter is set to zero, and the second amplifier is configured to receive a current of the current output digital-to-analogue converter while a signal based on the RF-signal is set to zero, and the first amplifier is configured to receive the current of the current output digital-to-analogue converter while the signal based on the RF-signal is set to zero, and the second amplifier is configured to receive the signal based on the RF-signal while the current of the current output digital-to-analogue converter is set to zero.

In particular, the present method is to be implemented in and made operable by means of the detector circuit as described above. Therefore, any features, benefits and general properties of the claimed method equally apply to the detector circuit and vice versa.

BRIEF DESCRIPTION OF THE DRAWINGS

In the following, a preferred embodiment of the invention will be described in a non-limiting and exemplary way by making reference to the drawings, in which.

DETAILED DESCRIPTION OF THE INVENTION

Figure 1:
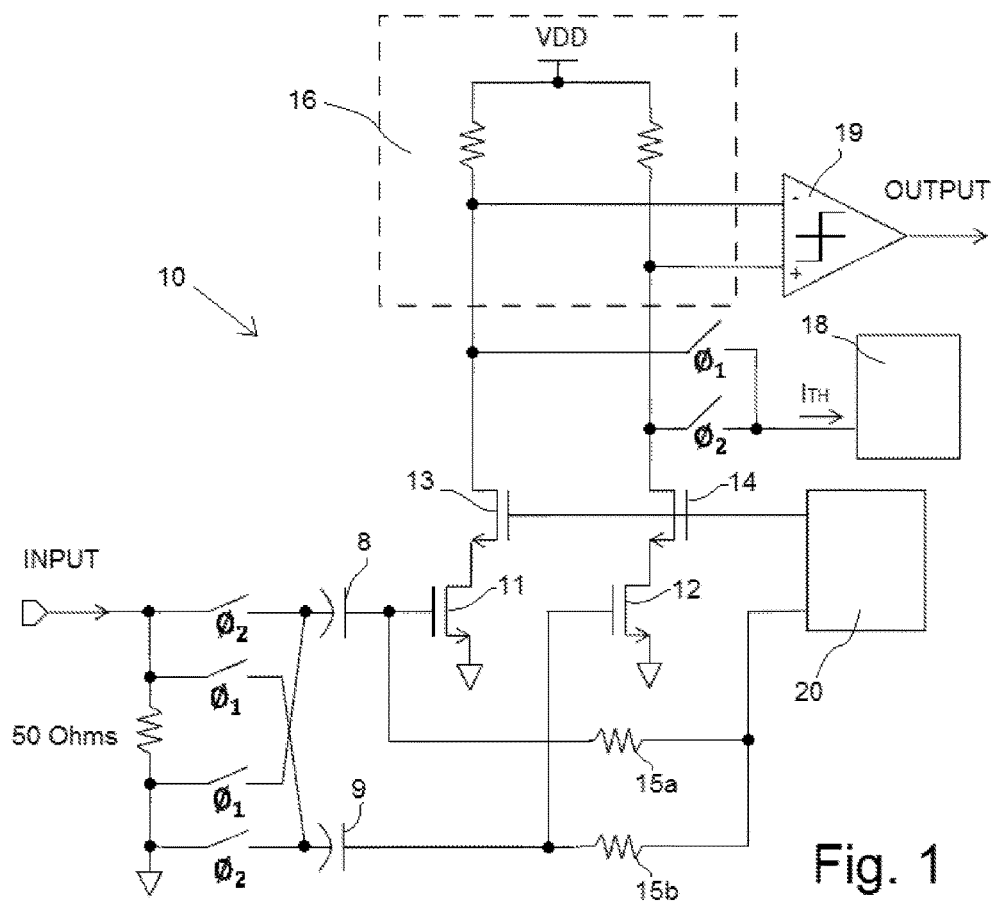
FIG. 1 schematically shows a block diagram of a detector circuit according to one embodiment of the present invention.

Various embodiments are described hereinafter with reference to the Figures. It should be noted that elements of similar structures or functions are represented by like reference numerals throughout the Figures. It should also be noted that the Figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

In FIG. 1 a block diagram of a detector circuit according to one embodiment of the present invention is schematically presented.

In the following, the components and the operation of the detector circuit are discussed in greater detail.

An energy source provides supply voltage $V_{DD}$ between 1.3 V and 2.0 V. A first and a second NMOS-transistors 11, 12 of the detector circuit 10 are biased in weak inversion by an output bias current. This output bias current is generated by a voltage from a bias current generator circuit 20. Resistors 15a, 15b are connected from the bias current generator circuit 20 to the gates of the NMOS-transistors 11, 12 to allow RF-signals to occur at the transistor gates without loading by the bias current generator 20.

A third NMOS-transistor 13 is arranged between the first NMOS-transistor 11 and a load device 16 whereas a fourth NMOS device 14 is arranged between the second NMOS-transistor 12 and the load device 16. In the shown embodiment, the load device 16 is a resistor but it could also be a conventional diode, an MOS transistor or an MOS transistor configured as a diode. The third and the fourth NMOS-transistors 13, 14 are basically used as cascodes in order to isolate the first and the second NMOS-transistors 11, 12 from other electrical signals present in the detector circuit 10.

As seen in FIG. 1, an RF-signal is alternately AC-coupled (INPUT) into the first and the second NMOS-transistors 11, 12 via capacitors 8, 9 during a first $\phi_1$ and a second $\phi_2$ phase, respectively. Simultaneously, the first and the second NMOS-transistors 11, 12 are alternately biased by means of the output bias current. The capacitors 8, 9 and the resistors 15a, 15b form a high-pass network that allows RF-signals to pass to the gate of the NMOS-transistors 11, 12. When an RF-signal is applied to one of the NMOS-transistors 11, 12, the average current through the transistor increases beyond the average current during periods without application of an RF-signal. Due to low-pass filtering action provided by the cascode transistors 13, 14, the load device 16 and the input of a comparator 19, very little RF-signal appears at the input of the comparator 19, however, the effect of the change in average current within NMOS-transistors 11, 12 will appear at the input to comparator 19.

A current output DAC (DAC-digital-to-analogue converter) 18 is alternately connected to the NMOS-transistors 13, 14 during a first $\phi_1$ and a second $\phi_2$ phase, respectively, and contributes in generating a threshold current. The DAC 18 is also connected to the load device 16. The detector circuit further comprises a comparator 19 connected to the load device 16. The purpose of the comparator 19 is based on the received RF-signals and the threshold current, to establish whether the signal detection threshold has been reached (OUTPUT). Operation of the comparator will be more thoroughly discussed in connection with FIG. 2.

Figure 2:
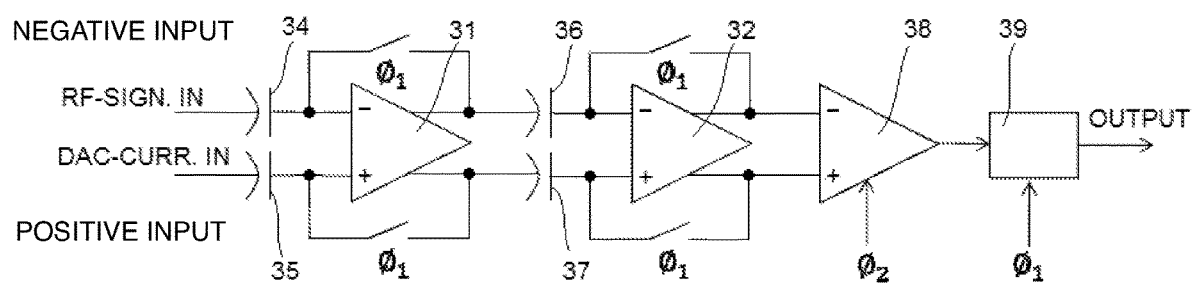
FIG. 2 is a schematic block diagram of a comparator that comprises a two-amplifier configuration driving a differential amplifier followed by a flip-flop.

FIG. 2 is a schematic block diagram of the output comparator which is a two-amplifier, auto-zeroing, configuration driving a differential amplifier followed by a flip-flop. The comparator is advantageously integrated in the detector circuit of FIG. 1.

It is shown a switched capacitor comparator 19 comprising a first amplifier 31 and a second amplifier 32. In one embodiment, amplifiers' 31, 32 gain is 20 dB. Capacitors 34-37 are used for data storage. The first 31 and the second 32 amplifiers could be auto-zero amplifiers operating so that each amplifier allows auto-zero of its input offset. The complementary inputs and outputs of amplifier 31 are shorted together during $\phi_1$ phase which results in the presence of the amplifier offset voltage at the input of amplifier 31. This voltage, plus any voltage applied at the positive and negative inputs is stored in capacitors 34 and 35. Similarly, the complementary inputs and outputs of amplifier 32 are shorted together during $\phi_1$ phase which results in the presence of the amplifier offset voltage at the input of amplifier 32. This voltage, plus any remaining offset at the output of amplifier 31 is stored in capacitors 34 and 35. During $\phi_2$ phase, the short between the amplifiers 31 and 32 inputs and outputs is removed and the amplifiers will generate their full gain with the associated offsets due to the two amplifiers 31 and 32 and the positive and negative inputs reduced to a small value well below the desired detection threshold voltage level.

In an alternative embodiment, the first 31 and the second 32 amplifiers could be auto-zero amplifiers operating in ping-pong mode so that each amplifier allows auto-zero of its input offset. While one of the amplifiers is zeroed during a first clock period, the other one is active. Then, during the next clock period, the previously zeroed amplifier is switched on, while the other amplifier is zeroed.

It is also shown a third amplifier 38 of the rail-to-rail type and a D flip-flop data storage element 39. The third amplifier 38 converts the differential output of amplifier 32 to a single-ended signal with rail-to-rail capability suitable for driving the input of the flip-flop 39. Third amplifier 38 is enabled during $\phi_2$ phase when amplifiers 31 and 32 are in amplifying mode. Thus the output of amplifier 38 is a single-ended representation of the input signal with a large increase in gain and will approach one of the power supply rails when the input voltage difference is above the threshold level. Flip-flop 39 acquires the output of amplifier 38 during $\phi_1$ phase which is after the signal at the output of amplifier 38 has settled during $\phi_2$ phase. The output of the flip-flop element 39 is a stable logic level to be presented to external logic circuitry that represents whether the input signal exceeds the overall comparator 19 threshold level.

With respect to the operation, a signal based on the RF-signal and a current of the current output DAC are input. In the first phase (also known as precharge-phase) the first amplifier 31 is configured to receive a signal based on the RF-signal (discussed in connection with FIG. 1) while a current value of the current output DAC (also discussed in connection with FIG. 1) is set to zero, and the second amplifier 32 is configured to receive a current of the current output DAC while a signal based on the RF-signal is set to zero. Further, in the second phase (also known as evaluate-phase) the first amplifier 31 is configured to receive the current of the current output DAC while the signal based on the RF-signal is set to zero, and the second amplifier 32 is configured to receive the signal based on the RF-signal while the current of the current output DAC is set to zero.

By implementing the above in the detector circuit, for instance one shown in FIG. 1, it is taken into consideration that the incoming RF-signals and the currents of the detector circuit become so-to-say differential in nature. Accordingly, they will have different values in the first respectively the second phases of the clock cycle of the circuit. On the other hand, the offsets present in the circuit are systemic and will not change value during the two phases of the clock cycle. The resulting signals, including systemic offset values are stored by means of the capacitors 34-37.

Subsequently, the systemic circuit mismatch, i.e. the offsets, is removed by subtracting a resulting signal value obtained in the second phase (evaluate-phase) from a resulting signal value obtained in the first phase (precharge-phase). In this way, the mismatch data from the two phases essentially cancel one another. Above rationale is expressed by following equations (where detector currents across the NMOS-transistors 11, 12 of FIG. 1 are given as $I_{DET1}$ and $I_{DET2}$, respectively, offset1 and offset2 are the systemic offsets, R1 and R2 are impedances of the load devices 16 and $I_{TH}$ denotes threshold current originating from the DAC):

First (Precharge) Phase:

Amplifier 1 (Volts)=$f(RF \cdot I_{DET2}) \cdot R2$+offset2;

Here, RF is present and threshold current $I_{TH}$ (from DAC) is disconnected.

Amplifier 2 (Volts)=$(I_{TH}+I_{DET1}) \cdot R1$+offset1;

Here, threshold current $I_{TH}$ is present while no RF-signal is present.

$\Delta_{PRECHARGE}$=Amplifier 2-Amplifier 1

$\Delta_{PRECHARGE}$=[$f(RF \cdot I_{DET2}) \cdot R2$+offset2-$(I_{TH}+I_{DET1})$ $\cdot R1$+offset1]

Second (Evaluate) Phase:

Amplifier 1 (Volts)=$(I_{TH}+I_{DET2}) \cdot R2$+offset2;

Here, threshold current $I_{TH}$ is present while no RF-signal is present.

Amplifier 2 (Volts)=$f(RF \cdot I_{DET1}) \cdot R1$+offset1;

Here, RF is present and threshold current $I_{TH}$ is disconnected.

$\Delta_{EVALUATE}$=Amplifier 2-Amplifier 1

$\Delta_{EVALUATE}$=[$(I_{TH}+I_{DET2}) \cdot R2$+offset2-$f(RF \cdot I_{DET1}) \cdot R1$+offset1]

The obtained output value of FIG. 2, i.e. once the mismatch has at least been partially cancelled, is used to determine whether the AC-coupled RF-signal exceeds a detector threshold value. This is typically done by determining whether the obtained output value from the detector circuit exceeds zero. This is done by subtracting the resulting signal value obtained in the second phase $D_{EVALUATE}$ from a resulting signal value obtained in the first phase $\Delta_{PRECHARGE}$. If the result of this subtraction exceeds zero, the threshold has been reached. This is expressed by following equations:

$\Delta_{EVALUATE}-\Delta_{PRECHARGE}$=[$(I_{TH}+I_{DET2}) \cdot R2$+offset2-$f(RF \cdot I_{DET1})$+offset1]-[$f(RF \cdot I_{DET2}) \cdot R2$+offset2-$(I_{TH}+I_{DET1}) \cdot R1$+offset1]

$\Delta_{EVALUATE}-\Delta_{PRECHARGE}$=[$f(RF \cdot I_{DET2}) \cdot R2$+$f(RF \cdot I_{DET1}) \cdot R1$]-[$(I_{TH}-I_{DET1}) \cdot R1$+$I_{TH}+I_{DET2}) \cdot R2$]

As seen from the above, the offsets (offset1 and offset2) are cancelled, whereby the signals add.

Conclusively, when $\Delta_{EVALUATE} > \Delta_{PRECHARGE}$, the comparator will indicate that the RF-signal level is greater than the programmed $I_{TH}$. In consequence, the threshold is deemed to have been achieved.

It is to be noted that if there are no systemic offsets present in the circuit, i.e. R1=R2 and $I_{DET1}=I_{DET2}$, than the result of the equation $\Delta_{EVALUATE}-\Delta_{PRECHARGE}$ may be reduced to $2 \cdot RF \cdot I_{DET}-2 \cdot I_{TH}$, resulting in a signal amplitude having twice the magnitude compared with a single-ended approach.

In the drawings and the description, there have been disclosed typical preferred embodiments of the invention and, although specific terms are employed, they are used in a generic and descriptive sense only and not for purposes of limitation, the scope of the invention being set forth in the following claims.

What is claimed is:

1. A method for improving threshold accuracy of a detector circuit being part of an RFID-device, comprising the steps of:
    providing a comparator comprising a first amplifier and a second amplifier,
    providing a current output digital-to-analogue converter,
    AC-coupling an RF-signal into the detector circuit,
    applying, during a first phase, a signal based on the RF-signal into the first amplifier while a current value of the current output digital-to-analogue converter is set to zero,
    applying, during the first phase, a current value of the current output digital-to-analogue converter into the second amplifier while a signal based on the RF-signal is set to zero,
    applying, during a second phase, the current of the current output digital-to-analogue converter into the first amplifier while the signal based on the RF-signal is set to zero,
    applying, during the second phase, the signal based on the RF-signal into the second amplifier while the current of the current output digital-to-analogue converter is set to zero;
    obtaining an output value by subtracting a resulting signal value obtained in the second phase from a resulting signal value obtained in the first phase; and
    determining using the obtained output value whether the AC-coupled RF-signal exceeds a detector threshold value.

2. A method for improving threshold accuracy of a detector circuit being part of an RFID-device, comprising:
    providing a comparator comprising a first amplifier and a second amplifier,
    providing a current output digital-to-analogue converter,
    AC-coupling an RF-signal into the detector circuit,
    applying, during a first phase, a signal based on the RF-signal into the first amplifier while a current value of the current output digital-to-analogue converter is set to zero,
    applying, during the first phase, a current value of the current output digital-to-analogue converter into the second amplifier while a signal based on the RF-signal is set to zero,
    applying, during a second phase, the current of the current output digital-to-analogue converter into the first amplifier while the signal based on the RF-signal is set to zero, and
    applying, during the second phase, the signal based on the RF-signal into the second amplifier while the current of the current output digital-to-analogue converter is set to zero,
    wherein the comparator is a switched capacitor comparator that samples continuous signals of the first and the second phases.

3. The method according to claim 2, wherein the sampled values are stored on at least one capacitor being part of the switched capacitor comparator.

4. A method for improving threshold accuracy of a detector circuit being part of an RFID-device, comprising:
    providing a comparator comprising a first amplifier and a second amplifier,
    providing a current output digital-to-analogue converter,
    AC-coupling in an RF-signal into the detector circuit,
    applying, during a first phase, a signal based on the RF-signal into the first amplifier while a current value of the current output digital-to-analogue converter is set to zero,
    applying, during the first phase, a current value of the current output digital-to-analogue converter into the second amplifier while a signal based on the RF-signal is set to zero,
    applying, during a second phase, the current of the current output digital-to-analogue converter into the first amplifier while the signal based on the RF-signal is set to zero, and
    applying, during the second phase, the signal based on the RF-signal into the second amplifier while the current of the current output digital-to-analogue converter is set to zero,
    wherein the first and the second amplifiers are auto-zero amplifiers operating in ping-pong mode.

5. A detector circuit being part of an RFID-device, the detector circuit comprising:
    a switched capacitor comparator comprising a first amplifier and a second amplifier;
    a current output digital-to-analogue converter; and
    means for AC-coupling an RF-signal into the detector circuit,
    wherein:
    the first amplifier is configured to receive a signal based on the RF-signal while a current value of the current output digital-to-analogue converter is set to zero, and the second amplifier is configured to receive a current of the current output digital-to-analogue converter while a signal based on the RF-signal is set to zero, and
    the first amplifier is configured to receive the current of the current output digital-to-analogue converter while the signal based on the RF-signal is set to zero, and the second amplifier is configured to receive the signal based on the RF-signal while the current of the current output digital-to-analogue converter is set to zero.

6. The detector circuit according to claim 5, wherein the switched capacitor comparator comprises at least one capacitor for data storage.

7. A detector circuit being part of an RFID-device, the detector circuit comprising:
    a comparator comprising a first amplifier and a second amplifier;
    a current output digital-to-analogue converter; and
    means for AC-coupling an RF-signal into the detector circuit,
    wherein:
    the first amplifier is configured to receive a signal based on the RF-signal while a current value of the current output digital-to-analogue converter is set to zero, and the second amplifier is configured to receive a current of the current output digital-to-analogue converter while a signal based on the RF-signal is set to zero,
    the first amplifier is configured to receive the current of the current output digital-to-analogue converter while the signal based on the RF-signal is set to zero, and the second amplifier is configured to receive the signal based on the RF-signal while the current of the current output digital-to-analogue converter is set to zero, and wherein the first and the second amplifiers are auto-zero amplifiers operating in ping-pong mode.

8. A detector circuit being part of an RFID-device, the detector circuit comprising:

a comparator comprising a first amplifier and a second amplifier, a third amplifier, the third amplifier being of the rail-to-rail type;

a current output digital-to-analogue converter, means for AC-coupling in an RF-signal into the detector circuit, wherein:

the first amplifier is configured to receive a signal based on the RF-signal while a current value of the current output digital-to-analogue converter is set to zero, and the second amplifier is configured to receive a current of the current output digital-to-analogue converter while a signal based on the RF-signal is set to zero, and the first amplifier is configured to receive the current of the current output digital-to-analogue converter while the signal based on the RF-signal is set to zero, and the second amplifier is configured to receive the signal based on the RF-signal while the current of the current output digital-to-analogue converter is set to zero.

9. The detector circuit according to claim 8, wherein the detector circuit further comprises a data storage element.

10. A comparator circuit being part of a detector circuit of an RFID-device, the comparator circuit comprising:

at least one capacitor for data storage;

a first amplifier; and a second amplifier, wherein:

the first amplifier is configured to receive a signal based on an RF-signal received by the detector circuit while a reference current signal is set to zero, and the second amplifier is configured to receive the reference current signal while the signal based on the RF-signal is set to zero, and the first amplifier is configured to receive the reference current signal while the signal based on the RF-signal is set to zero, and the second amplifier is configured to receive the signal based on the RF-signal while the reference current signal is set to zero.

11. A comparator circuit being part of a detector circuit of an RFID-device, the comparator circuit comprising:

a first amplifier, a second amplifier, and a third amplifier, the third amplifier being of the rail-to-rail type, wherein:

the first amplifier is configured to receive a signal based on an RF-signal received by the detector circuit while a reference current signal is set to zero, and the second amplifier is configured to receive the reference current signal while the signal based on the RF-signal is set to zero, and the first amplifier is configured to receive the reference current signal while the signal based on the RF-signal is set to zero, and the second amplifier is configured to receive the signal based on the RF-signal while the reference current signal is set to zero.

12. The detector circuit according to claim 8, wherein the data storage element is a D flip-flop.

* * * * *